(12) United States Patent
Liu et al.

(10) Patent No.: US 9,954,100 B2
(45) Date of Patent: Apr. 24, 2018

(54) METHOD AND APPARATUS FOR HIGH VOLTATE TRANSISTORS

(71) Applicant: Taiwan Semiconductor Manufacturing Company, Ltd., Hsin-Chu (TW)

(72) Inventors: Ming-Chyi Liu, Hsin-Chu (TW); Pei-Lun Wang, Zhubei (TW); Yuan-Tai Tseng, Zhubei (TW); Yu-Hsing Chang, Taipei (TW); Shih-Chang Liu, Alian Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/079,855

(22) Filed: Mar. 24, 2016

(65) Prior Publication Data
US 2017/0278963 A1  Sep. 28, 2017

(51) Int. Cl.
*H01L 29/66* (2006.01)
*H01L 29/78* (2006.01)
(Continued)

(52) U.S. Cl.
CPC .... *H01L 29/7823* (2013.01); *H01L 21/26513* (2013.01); *H01L 21/31144* (2013.01); *H01L 21/32055* (2013.01); *H01L 21/32139* (2013.01); *H01L 21/76897* (2013.01); *H01L 23/535* (2013.01); *H01L 29/0649* (2013.01);
(Continued)

(58) Field of Classification Search
CPC .............. H01L 21/761; H01L 29/1045; H01L 29/1087; H01L 29/402; H01L 29/407; H01L 29/4175; H01L 29/66659; H01L 29/66689; H01L 29/7816; H01L 29/7835; H01L 29/7823; H01L 29/0649; H01L 29/665; H01L 29/66515; H01L 29/66545; H01L 29/66681; H01L 21/7823; H01L 21/26513; H01L 21/31144;
(Continued)

(56) References Cited

U.S. PATENT DOCUMENTS

| 2012/0228704 A1* | 9/2012 | Ju ......................... H01L 29/402 257/339 |
| 2013/0020632 A1* | 1/2013 | Disney .................. H01L 29/402 257/328 |

(Continued)

*Primary Examiner* — Mohammed Shamsuzzaman
(74) *Attorney, Agent, or Firm* — Slater Matsil, LLP

(57) ABSTRACT

A method includes forming a gate spacer along sidewalls of a gate structure, forming a source region and a drain region on opposite sides of the gate structure, wherein a sidewall of the source region is vertically aligned with a first sidewall of the gate spacer, depositing a dielectric layer over the substrate, depositing a conductive layer over the dielectric layer, patterning the dielectric layer and the conductive layer to form a field plate, wherein the dielectric layer comprises a horizontal portion extending from the second drain/source region to a second sidewall of the gate spacer and a vertical portion formed along the second sidewall of the gate spacer, forming a plurality of metal silicide layers by applying a salicide process to the conductive layer, the gate structure, the first drain/source region and the second drain/source region and forming contact plugs over the plurality of metal silicide layers.

21 Claims, 14 Drawing Sheets

(51) Int. Cl.
  *H01L 21/265* (2006.01)
  *H01L 21/311* (2006.01)
  *H01L 21/3205* (2006.01)
  *H01L 21/3213* (2006.01)
  *H01L 21/768* (2006.01)
  *H01L 23/535* (2006.01)
  *H01L 29/06* (2006.01)
  *H01L 29/40* (2006.01)
  *H01L 29/45* (2006.01)

(52) U.S. Cl.
  CPC ............ *H01L 29/402* (2013.01); *H01L 29/45* (2013.01); *H01L 29/665* (2013.01); *H01L 29/66515* (2013.01); *H01L 29/66545* (2013.01); *H01L 29/66681* (2013.01)

(58) Field of Classification Search
  CPC ......... H01L 21/32055; H01L 21/32139; H01L 21/76897; H01L 23/535
  USPC ........ 257/384, 343, 337, 339, 329, 328, 410
  See application file for complete search history.

(56) References Cited

U.S. PATENT DOCUMENTS

2013/0134512 A1* 5/2013 Cheng .................. H01L 29/402
  257/339
2013/0228878 A1* 9/2013 Wang ................ H01L 21/76224
  257/410
2013/0320431 A1* 12/2013 Su .................. H01L 21/823487
  257/329
2013/0320432 A1* 12/2013 Ng ................. H01L 21/823487
  257/329
2013/0320443 A1* 12/2013 Levin .................... H01L 27/088
  257/337
2014/0197489 A1* 7/2014 Chu .................... H01L 29/7816
  257/343

* cited by examiner

US 9,954,100 B2

METHOD AND APPARATUS FOR HIGH VOLTATE TRANSISTORS

BACKGROUND

The semiconductor industry has experienced rapid growth due to improvements in the integration density of a variety of electronic components. As semiconductor technologies further evolve, metal oxide semiconductor (MOS) transistors have been widely used in today's integrated circuits. MOS transistors are voltage controlled device. When a control voltage is applied to the gate a MOS transistor and the control voltage is greater than the threshold of the MOS transistor, a conductive channel is established between the drain and the source of the MOS transistor. As a result, a current flows between the drain and the source of the MOS transistor. On the other hand, when the control voltage is less than the threshold of the MOS transistor, the MOS transistor is turned off accordingly.

MOS transistors may include two major categories. One is n-channel MOS transistors; the other is p-channel MOS transistors. According to the structure difference, MOS transistors can be further divided into two sub-categories, planar MOS transistors and vertical MOS transistors. As semiconductor technologies further advance, new power MOS devices have emerged to further improve key performance characteristics such as voltage rating, power handling capability and reliability. For example, lateral double diffused MOS transistors are capable of delivering more current per unit area while maintaining a high breakdown voltage. Lateral double diffused MOS transistors may be alternatively referred to as high voltage MOS transistors.

In order to reduce source, drain and gate resistances of high voltage MOS transistors, a salicide process may be employed to form metal silicide contacts on top of the source, drain and gate electrode regions prior to forming contact plugs connected to the source, drain and gate electrode regions respectively. The most common metal silicide materials are nickel silicide and cobalt silicide. In the salicide process, a thin layer of metal is blanket deposited over the semiconductor substrate. In particular, the thin layer of metal is deposited over the exposed source, drain and gate electrode regions. One or more annealing processes may be applied to the thin layer of metal. These annealing processes cause the metal to selectively react with the exposed silicon of the source, drain and gate electrode regions, thereby forming metal silicide layers on top of the source, drain and gate electrode regions respectively. After the metal silicide layers have been formed, the un-reacted metal is removed. In addition, a plurality of contact plugs may be formed over the source, drain and gate electrode regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
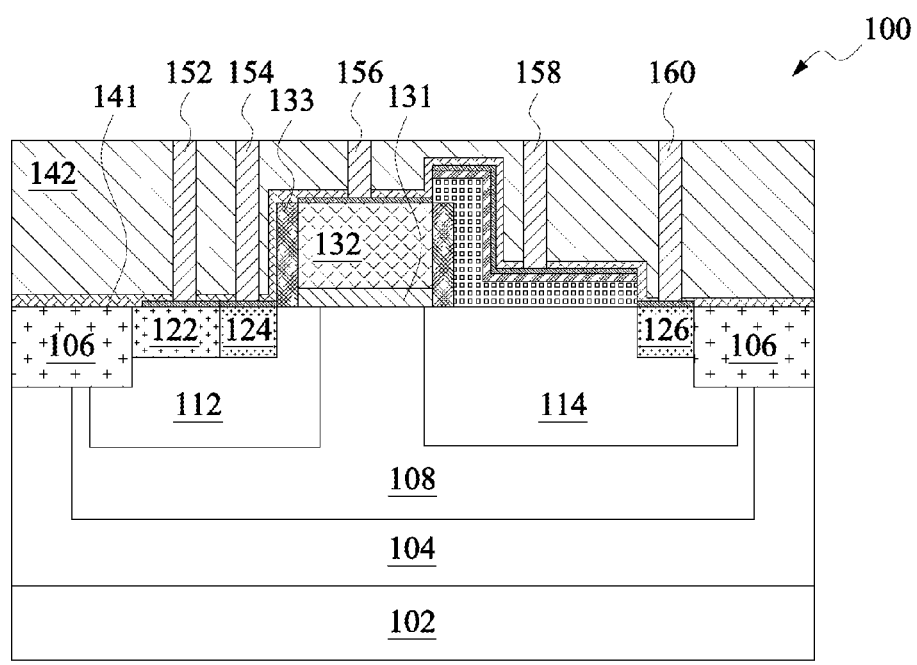
FIG. 1 illustrates a cross sectional view of a MOS transistor in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, a double-diffused metal oxide semiconductor (MOS) transistor. The embodiments of the disclosure may also be applied, however, to a variety of high voltage MOS transistors such as silicon based high voltage transistors, gallium nitride (GaN) based high voltage transistors and the like. Hereinafter, various embodiments will be explained in detail with reference to the accompanying drawings.

FIG. 1 illustrates a cross sectional view of a MOS transistor in accordance with various embodiments of the present disclosure. The MOS transistor 100 comprises a first drain/source region 124, a second drain/source region 126 and a gate electrode 132. As shown in FIG. 1, the gate electrode 132 is formed over a gate dielectric layer 131. The gate electrode 132 and the gate dielectric layer 131 form a gate structure 130. The first drain/source region 124 and the second drain/source region are formed on opposite sides of the gate electrode 132. A gate spacer 133 is formed along sidewalls of the gate structure 130. A sidewall of the first drain/source region 124 is vertically aligned with a sidewall of the gate spacer 133.

FIG. 1 further illustrates the MOS transistor 100 comprises a field plate 136 formed between the gate spacer 133 and the second drain/source region 126. In other words, the second drain/source region 126 and the gate electrode 132 are separated by the field plate 136. As shown in FIG. 1, the field plate 136 is formed over a dielectric layer 134. The field plate 136 is a conductive field plate comprising a conductive layer and a metal silicide layer over the conductive layer.

The dielectric layer 134 comprises a first horizontal portion extending from the sidewall of the gate spacer 133 to the edge of the second drain/source region 126, a vertical portion formed along the sidewall of the gate spacer 133 and a second horizontal portion formed on top of the gate spacer 133. It should be noted that the second horizontal portion shown in FIG. 1 is merely an example. A person skilled in the art would understand there may be many variations, modifications and alternatives. For example, the second horizontal portion may extend over the edge of the gate spacer 133 and partially cover the top surface of the gate electrode 132.

The MOS transistor 100 further comprises a body pickup region 122 formed adjacent to the first drain/source region 124. In some embodiments, the MOS transistor 100 is an n-type MOS transistor. The first drain/source region 124 is an n-type source region. The second drain/source region 126 is an n-type drain region. As shown in FIG. 1, both the body pickup region 122 and the first drain/source region 124 are formed in a p-type body region 112. The second drain/source region 126 is formed in an n-type doped drain region 114. Both the p-type body region 112 and the n-type doped drain region 114 are formed in an n-type well 108. The n-type well 108 is formed in a p-type epitaxial layer 104, which is grown over a p-type substrate 102.

The MOS transistor 100 further comprises a plurality of isolation regions 106 formed over the substrate 102, an etch stop layer 141 and an inter-layer dielectric (ILD) layer 142 formed over the substrate 102. As shown in FIG. 1, a plurality of contact plugs 152, 154, 156, 158 and 160 are formed in the ILD layer 142 and connected to the body pickup region 122, the first drain/source region 124, the gate electrode 132, the field plate 136 and the second drain/source region 126 respectively. The detailed formation process of the MOS transistor 100 will be described below with respect to FIGS. 2-14.

In some embodiments, a metal silicide layer is formed on top of the field plate 136. The metal silicide layer may be formed by applying a salicide process to an exposed conductive layer such as a poly-silicon layer. More particularly, the metal silicide layer on the field plate 136 is formed in a same manner as the metal silicide layers over the body pickup region 122, the first drain/source region 124, the gate electrode 132 and the second drain/source region 126. As such, the contact plug connected to the field plate 136 can be formed in the same contact fabrication process as the contact plugs connected to the drain, source and gate regions.

One advantageous feature of having a metal silicide layer on the field plate 136 is that by employing the salicide process, the contact resistance can be reduced; the extra masks for forming the field plate can be saved; and the contact plug connected to the field plate 136 can be formed during the back-end-of-line metallization process. As a result, the cost of the MOS transistor 100 can be reduced. In addition, the reliability of the MOS transistor 100 can be improved.

FIGS. 2-14 illustrate cross section views of intermediate steps of fabricating the MOS transistor shown in FIG. 1 in accordance with various embodiments of the present disclosure. It should be noted that the fabrication steps shown in FIGS. 2-14 are merely an example. A person skilled in the art will recognize there may be many alternatives, variations and modifications. For example, the fabrication steps in FIGS. 2-14 provide methods of forming an n-type MOS transistor. One skilled in the art will realize that the fabrication steps may be applicable to forming p-type MOS transistors by inverting the conductivity types of the respective doped semiconductor regions.

Figure 2:
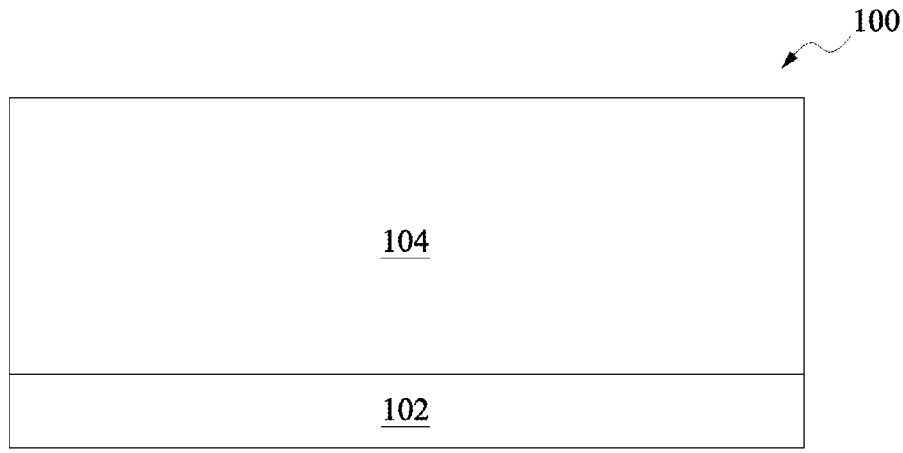
FIG. 2 illustrates a cross section view of a semiconductor device after an epitaxial layer has been formed over a substrate in accordance with various embodiments of the present disclosure.

FIG. 2 illustrates a cross section view of a semiconductor device after an epitaxial layer has been formed over a substrate in accordance with various embodiments of the present disclosure. The semiconductor device 100 includes a substrate 102 and an epitaxial layer 104 over the substrate 102. The substrate 102 is formed of silicon, although it may also be formed of other group III, group IV, and/or group V elements, such as silicon, germanium, gallium, arsenic, and combinations thereof.

As is known to those of skill in the art, the use of dopant atoms in an implant step may form the substrate 102 with a particular conductivity type. Depending on different applications, the substrate 102 may be n-type or p-type. In some embodiments, the substrate 102 is a p-type substrate. Appropriate p-type dopants such as boron, gallium, indium and/or the like are implanted into the substrate 102. Alternatively, the substrate 102 is an n-type substrate. Appropriate n-type dopants such as phosphorous, arsenic and/or the like are implanted into the substrate 102. In embodiments shown in FIGS. 2-14, the substrate 102 is a p-type substrate.

The epitaxial layer 104 is grown from the substrate 102. In some embodiments, the epitaxial layer 104 is a p-type epitaxial layer grown from the p-type substrate 102. The epitaxial growth of the p-type epitaxial layer 104 may be implemented by using suitable semiconductor fabrication processes such as chemical vapor deposition (CVD), ultra-high vacuum chemical vapor deposition (UHV-CVD) and the like. In accordance with an embodiment, the p-type epitaxial layer 104 is of a doping density in a range from about $10^{14}/cm^3$ to about $10^{16}/cm^3$.

Figure 3:
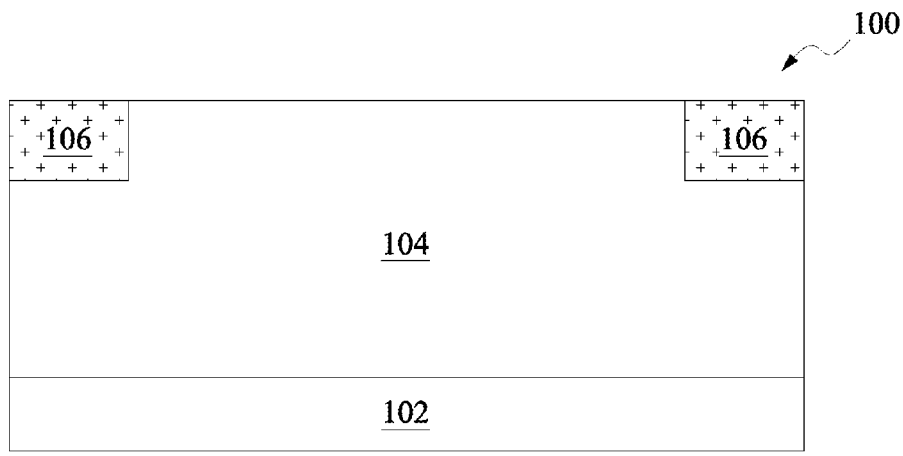
FIG. 3 illustrates a cross section view of the semiconductor device shown in FIG. 2 after a plurality of isolation regions have been formed in accordance with various embodiments of the present disclosure.

FIG. 3 illustrates a cross section view of the semiconductor device shown in FIG. 2 after a plurality of isolation regions have been formed in accordance with various embodiments of the present disclosure. The isolation regions 106 may be shallow trench isolation (STI) regions, and may be formed by etching the epitaxial layer 104 to form a plurality of trenches and filling the plurality of trenches with a dielectric material as is known in the art. For example, the isolation regions 106 may be filled with a dielectric material such as an oxide material, a high-density plasma (HDP) oxide and/or the like. The dielectric materials are formed using suitable semiconductor deposition techniques such as CVD and/or the like.

A planarization process such as a chemical mechanical planarization (CMP) process may be applied to the top surface of the epitaxial layer 104 so that the excess dielectric material may be removed as a result. In the CMP process, a combination of etching materials and abrading materials are put into contact with the top surface of the epitaxial layer 104 and a grinding pad (not shown) is used to grind away the excess dielectric material formed on top of the epitaxial layer 104 until the top surface of the epitaxial layer 104 is exposed.

Figure 4:
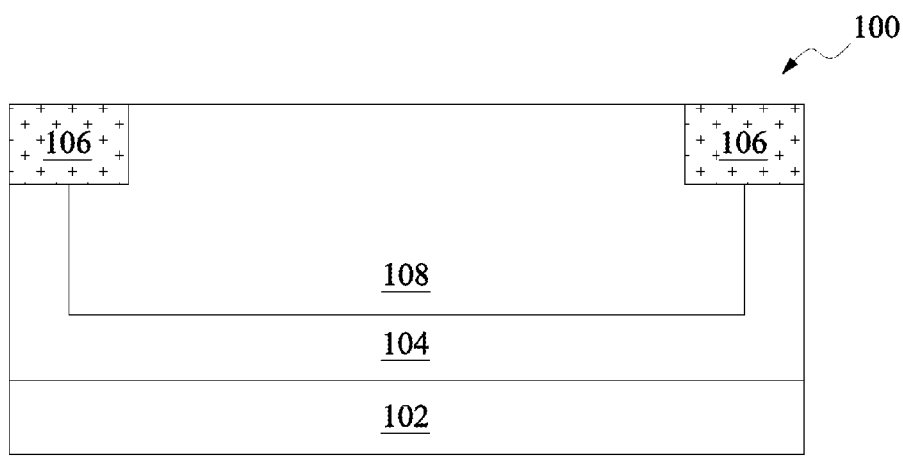
FIG. 4 illustrates a cross section view of the semiconductor device shown in FIG. 3 after an ion implantation process is applied to the semiconductor device in accordance with various embodiments of the present disclosure.

FIG. 4 illustrates a cross section view of the semiconductor device shown in FIG. 3 after an ion implantation process is applied to the semiconductor device in accordance with various embodiments of the present disclosure. A high voltage n-type well region 108 is formed in the epitaxial layer 104 through suitable semiconductor doping techniques such as an ion implantation process. In some embodiments, appropriate n-type dopants such as phosphorous, arsenic and/or the like are implanted into the epitaxial layer 104 to form the high voltage n-type well region 108.

In some embodiments, the doping concentration of the high voltage n-type well region 108 is in a range from about $1\times10^{15}/cm^3$ to about $1\times10^{18}/cm^3$. By controlling the ion implantation energy, the depth of the high voltage n-type well region 108 may be adjusted accordingly.

One skilled in the art will recognize that FIG. 4 illustrates an ideal profile. The dimensions of the high voltage n-type well region 108 may vary after subsequent fabrication processes.

Figure 5:
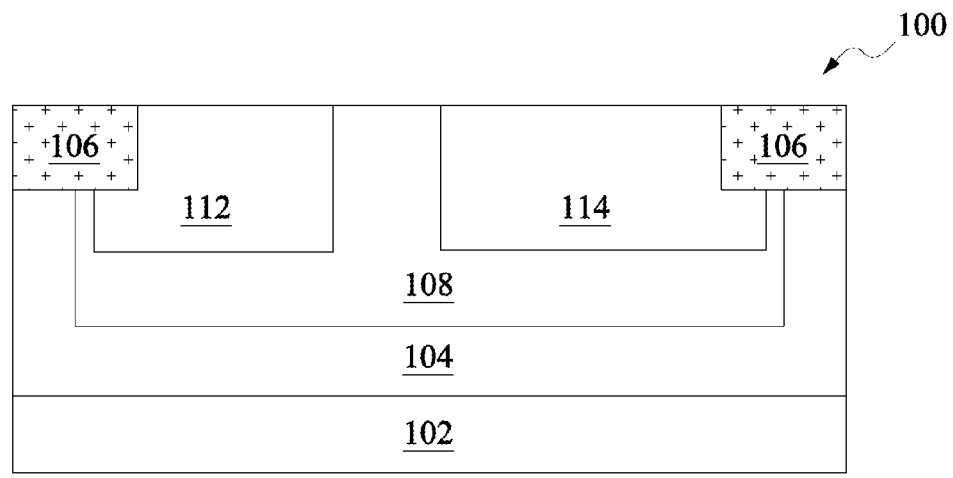
FIG. 5 illustrates a cross section view of the semiconductor device shown in FIG. 4 after a p-type body region and an n-type doped drain region have been formed in accordance with various embodiments of the present disclosure.

FIG. 5 illustrates a cross section view of the semiconductor device shown in FIG. 4 after a p-type body region and an n-type doped drain region have been formed in accordance with various embodiments of the present disclosure. The p-type body region 112 and the n-type doped drain region 114 are formed through suitable semiconductor doping techniques such as an ion implantation process. In some embodiments, appropriate p-type dopants such as boron, gallium, indium and/or the like are implanted into the high voltage n-type well region 108 to form the p-type body region 112 Likewise, appropriate n-type dopants such as phosphorous, arsenic and/or the like are implanted into the high voltage n-type well region 108 to form the doped drain region 114.

In some embodiments, the doping concentration of the p-type body region 112 and the n-type doped drain region 114 is in a range from about $1\times10^{16}/cm^3$ to about $1\times10^{19}/cm^3$. By controlling the ion implantation energy, the depths of the p-type body region 112 and the n-type doped drain region 114 may be adjusted accordingly.

One skilled in the art will recognize that FIG. 5 illustrates an ideal profile. The dimensions of the p-type body region 112 and the n-type doped drain region 114 may vary after subsequent fabrication processes.

Figure 6:
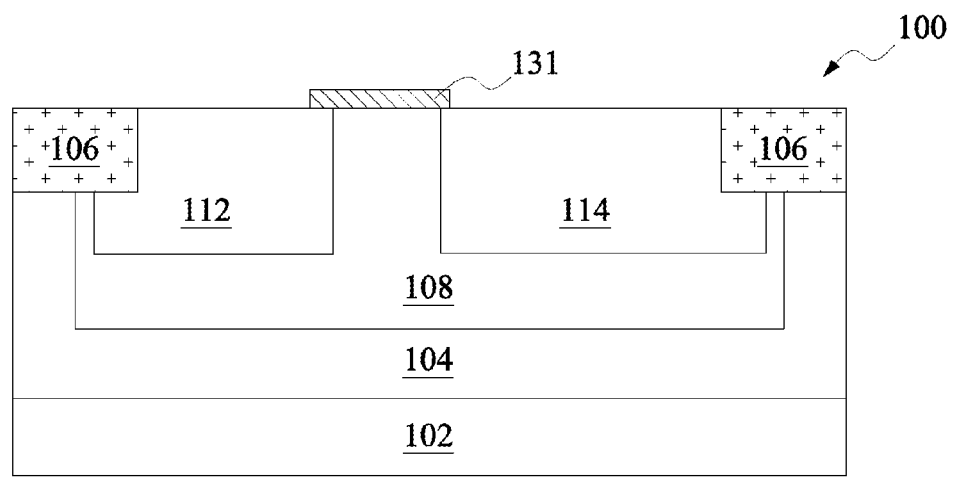
FIG. 6 illustrates a cross section view of the semiconductor device shown in FIG. 5 after a gate dielectric layer is formed over the substrate in accordance with various embodiments of the present disclosure.

FIG. 6 illustrates a cross section view of the semiconductor device shown in FIG. 5 after a gate dielectric layer is formed over the substrate in accordance with various embodiments of the present disclosure. The gate dielectric layer 131 is formed on the top surface of the semiconductor device 100. The gate dielectric layer 131 may be formed of a dielectric material such as silicon oxide, silicon oxynitride, silicon nitride, an oxide, a nitrogen-containing oxide, a combination thereof and/or the like. The gate dielectric layer 131 may have a relative permittivity value greater than about 4. Other examples of such materials include aluminum oxide, lanthanum oxide, hafnium oxide, zirconium oxide, hafnium oxynitride, combinations thereof and/or the like.

In an embodiment in which the gate dielectric layer 131 comprise an oxide layer, the gate dielectric layer 131 may be formed by a plasma enhanced CVD (PECVD) process using tetraethoxysilane (TEOS) and oxygen as a precursor. In accordance with an embodiment, the gate dielectric layer 131 may be of a thickness in a range from about 8 Å to about 200 Å.

Figure 7:
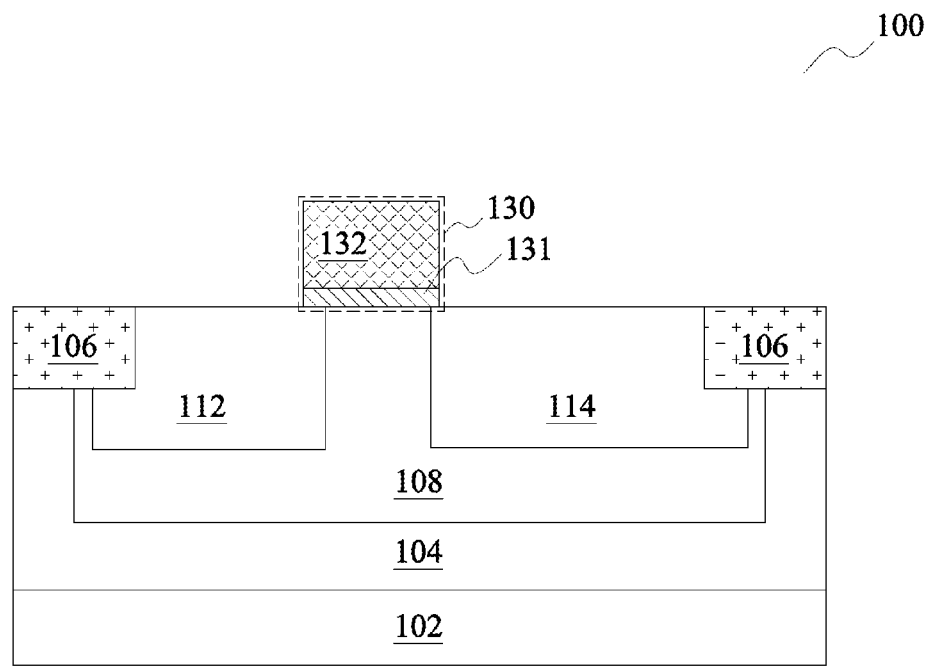
FIG. 7 illustrates a cross section view of the semiconductor device shown in FIG. 6 after a gate electrode is formed over the gate dielectric layers in accordance with various embodiments of the present disclosure.

FIG. 7 illustrates a cross section view of the semiconductor device shown in FIG. 6 after a gate electrode is formed over the gate dielectric layers in accordance with various embodiments of the present disclosure. The gate electrode 132 is deposited over the gate dielectric layer 131. The gate electrode 132 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like.

In an embodiment in which the gate electrode 132 is formed of poly-silicon, the gate electrode 132 may be formed by depositing doped or undoped poly-silicon by low-pressure chemical vapor deposition (LPCVD) to a thickness in the range from about 400 Å to about 2,400 Å.

After the deposition of doped or undoped poly-silicon, an etching process may be employed to define the gate electrode 132.

Figure 8:
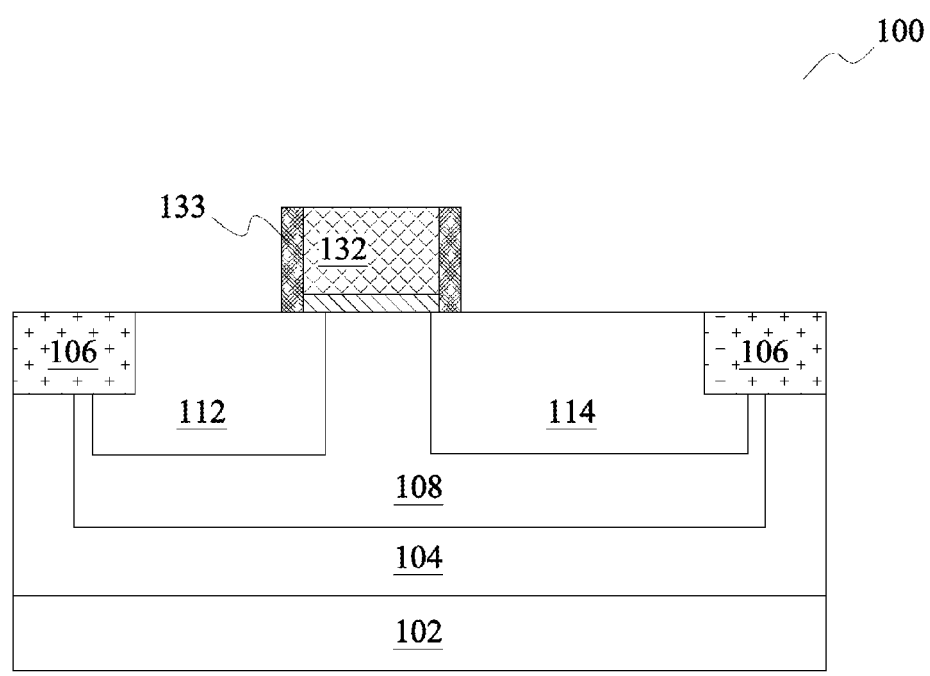
FIG. 8 illustrates a cross section view of the semiconductor device shown in FIG. 7 after a gate spacer is formed over the substrate in accordance with various embodiments of the present disclosure.

FIG. 8 illustrates a cross section view of the semiconductor device shown in FIG. 7 after a gate spacer is formed over the substrate in accordance with various embodiments of the present disclosure. The gate spacer 133 may be formed by blanket depositing one or more spacer layers (not shown) over the semiconductor device 100 and removing the horizontal portions. The remaining vertical portions of the dielectric layer form the gate spacer 133 as shown in FIG. 8. The gate spacer 133 may comprise suitable dielectric materials such as SiN, oxynitride, SiC, SiON, oxide and/or the like.

Figure 9:
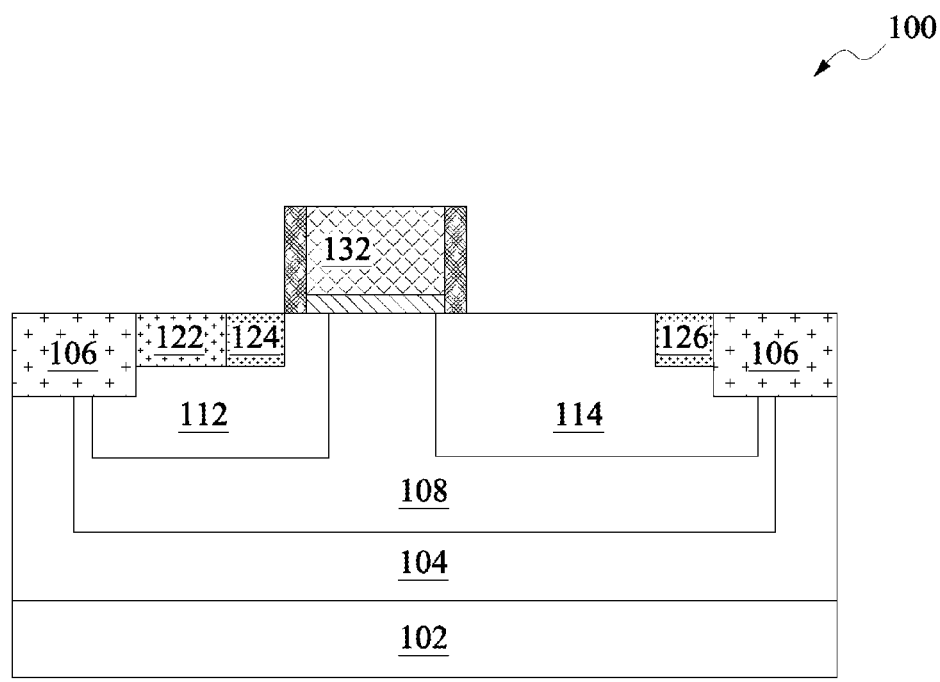
FIG. 9 illustrates a cross section view of the semiconductor device shown in FIG. 8 after body pickup and drain/source regions have been formed in accordance with various embodiments of the present disclosure.

FIG. 9 illustrates a cross section view of the semiconductor device shown in FIG. 8 after body pickup and drain/source regions have been formed in accordance with various embodiments of the present disclosure. In accordance with some embodiments, the drain/source regions (e.g., drain/source regions 124 and 126) and body pickup region (e.g., body pickup region 122) may be formed by implanting appropriate dopants.

In accordance with some embodiments, appropriate n-type dopants such as phosphorous, arsenic and/or the like are implanted into the p-type body region 112 and the n-type doped drain region 114 respectively to form the drain/source regions 124 and 126. The doping density of the drain/source regions (e.g., drain/source region 124) is in a range from about $10^{18}/cm^3$ to about $1\times10^{21}/cm^3$.

In accordance with some embodiments, appropriate p-type dopants such as boron, gallium, indium and/or the like are implanted into the p-type body region 112 to form the p-type body pickup region 122. The doping density of the p-type body pickup region 122 is in a range from about $10^{18}/cm^3$ to about $1\times10^{21}/cm^3$.

Figure 10:
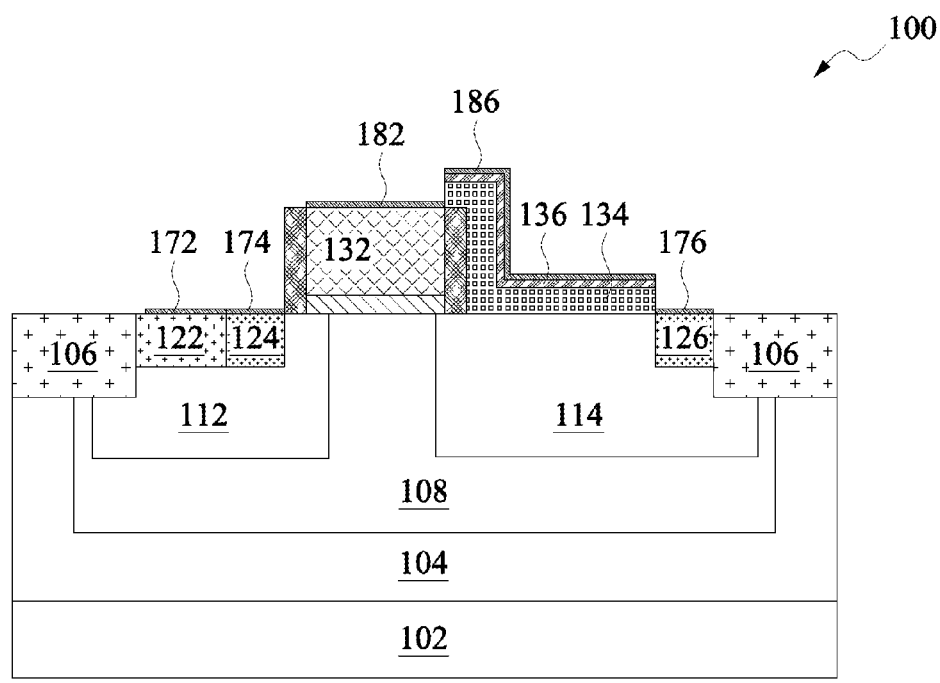
FIG. 10 illustrates a cross section view of the semiconductor device shown in FIG. 9 after the field plate has been formed over the substrate in accordance with various embodiments of the present disclosure.

FIG. 10 illustrates a cross section view of the semiconductor device shown in FIG. 9 after the field plate has been formed over the substrate in accordance with various embodiments of the present disclosure. In some embodiments, the field plate 136 is formed by blanket depositing a dielectric layer and a conductive layer over the semiconductor device 100, and performing an etching step to pattern the dielectric layer and the conductive layer to form the field plate 136 and the dielectric layer 134 shown in FIG. 10.

The patterning of the dielectric layer and the conductive layer may be performed using a same lithography mask, and hence the edges of the dielectric layer 134 are aligned to the respective edges of the field plate 136 as shown in FIG. 10.

In alternative embodiments, the patterning of the dielectric layer and the conductive layer may be performed using different lithography masks, and hence the edges of the dielectric layer 134 are not aligned to the respective edges of the field plate 136. The detailed fabrication steps of forming the misaligned edges will be described below with respect to FIGS. 16-21.

The conductive layer may comprise a conductive material such as poly-silicon or the like. Alternatively, the conductive layer may be formed of other commonly used conductive materials such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), other conductive materials, combinations thereof, and/or the like. The conductive layer may be deposited using suitable semiconductor deposition techniques.

The dielectric layer 134 may include silicon oxide, silicon nitride, silicon oxynitride, a high-k dielectric material, combinations thereof, or multi-layers thereof. The dielectric layer 134 may be deposited using suitable semiconductor deposition techniques. The dielectric layer 134 may be alternatively referred to as a resist protection oxide (RPO) dielectric layer. The dielectric layer 134 may have a thickness in a range from about 100 Å to about 2,500 Å. It should be noted that the thickness of the dielectric layer 134 may vary based upon different applications and design needs. In some embodiments, the thickness of the dielectric layer 134 may be selected based upon the breakdown voltage of the MOS transistor 100.

As shown in FIG. 10, the dielectric layer 134 comprises two horizontal portions and one vertical portion. A first horizontal portion is formed over the drift region, which is between the gate spacer 133 and the drain region 126. A second horizontal portion is formed on top of the gate spacer 133. A vertical portion is formed along the sidewall of the gate spacer 133. As shown in FIG. 10, the dielectric layer 134 may be a substantially conformal layer. The thickness of the horizontal portions of the dielectric layer 134 is substantially equal to the thickness of the vertical portion of the dielectric layer 134.

After the field plate has been formed as shown in FIG. 10, a salicide process may be applied to the body pickup region 122, the source 124, the gate electrode 132, the conductive layer and the drain 126. In the salicide process, a thin layer of metal is blanket deposited over the semiconductor device 100 having the exposed silicon regions (e.g., the drain, source, gate electrode and conductive layer shown in FIG. 10). The semiconductor device 100 is then subjected to one or more annealing steps. This annealing process causes the metal to selectively react with the exposed silicon regions, thereby forming metal silicide layers 172, 174, 176, 182 and 186 over the exposed silicon regions. In some embodiments, the metals used in the salicide process include titanium, platinum, cobalt, nickel and the like. However, other metals, such as manganese, palladium and the like, can also be used.

Figure 11:
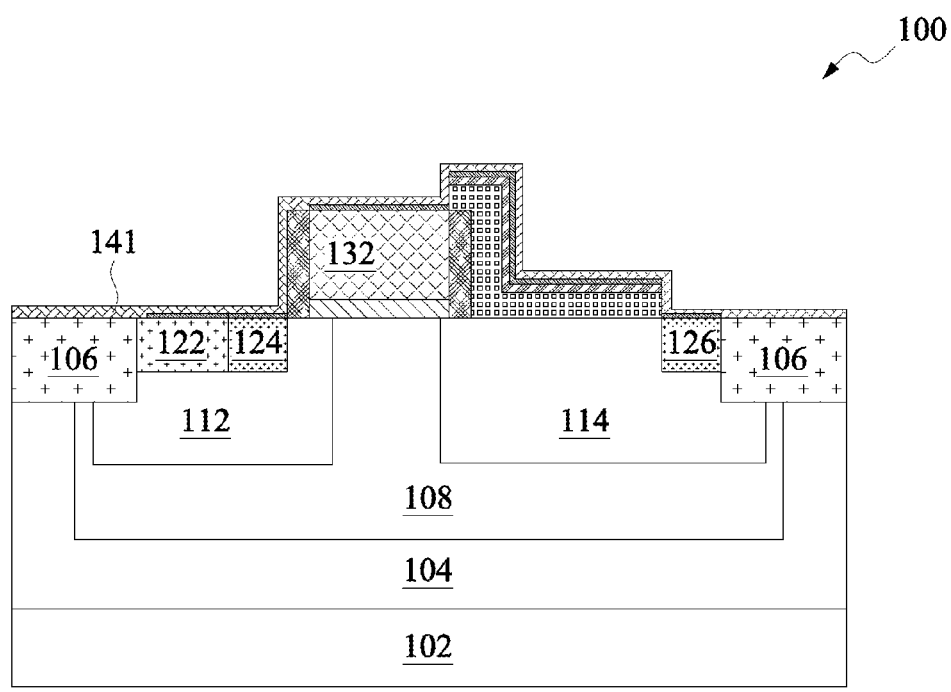
FIG. 11 illustrates a cross sectional view of the semiconductor device shown in FIG. 10 after a contact etch stop layer (CESL) is formed on the semiconductor device in accordance with various embodiments of the present disclosure.

FIG. 11 illustrates a cross sectional view of the semiconductor device shown in FIG. 10 after a contact etch stop layer (CESL) is formed on the semiconductor device in accordance with various embodiments of the present disclosure. The CESL 141 may comprise commonly used dielectric materials, such as silicon nitride, silicon oxynitride, silicon oxycarbide, silicon carbide, combinations thereof, and multi-layers thereof. The CESL 141 is deposited over the semiconductor device through suitable deposition techniques such as sputtering, CVD and the like.

Figure 12:
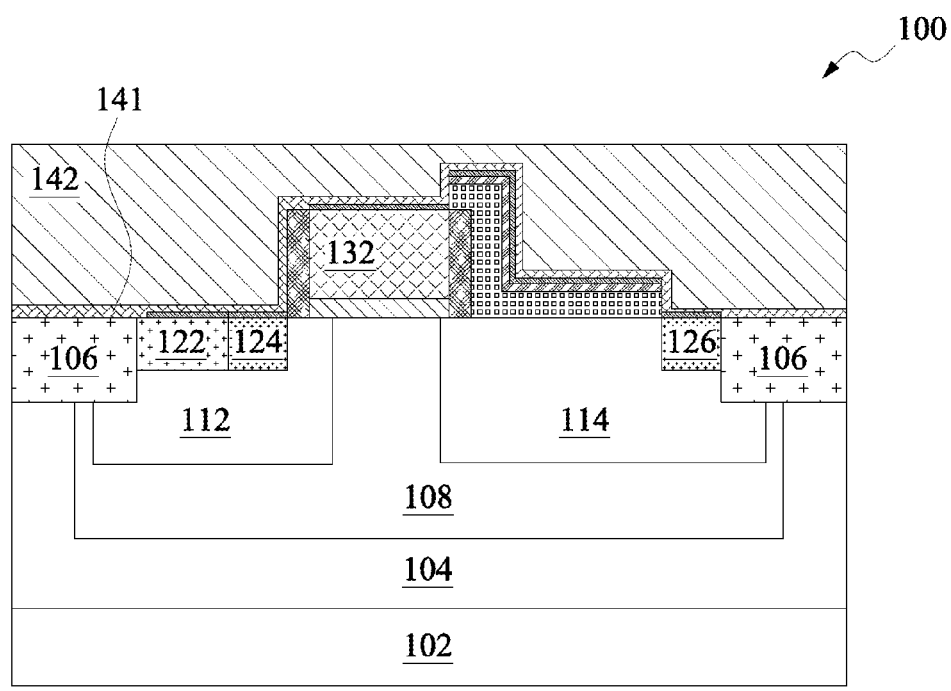
FIG. 12 illustrates a cross section view of the semiconductor device shown in FIG. 11 after a dielectric layer is deposited over the CESL layer in accordance with various embodiments of the present disclosure.

FIG. 12 illustrates a cross section view of the semiconductor device shown in FIG. 11 after a dielectric layer is deposited over the CESL layer in accordance with various embodiments of the present disclosure. The dielectric layer 142 is deposited over the CESL 141. The dielectric layer 142 may be alternatively referred to as an inter-layer dielectric (ILD) layer. The dielectric layer 142 may be a low-k dielectric layer having a low dielectric constant, for example, less than about 3.5. The dielectric layer 142 may also comprise a combination of materials, such as silicon nitride, silicon oxy-nitride, high-k dielectrics, low-k dielectrics, CVD poly-silicon or other dielectrics. The dielectric layer 142 may be deposited using suitable deposition techniques such as sputtering, CVD and the like.

Figure 13:
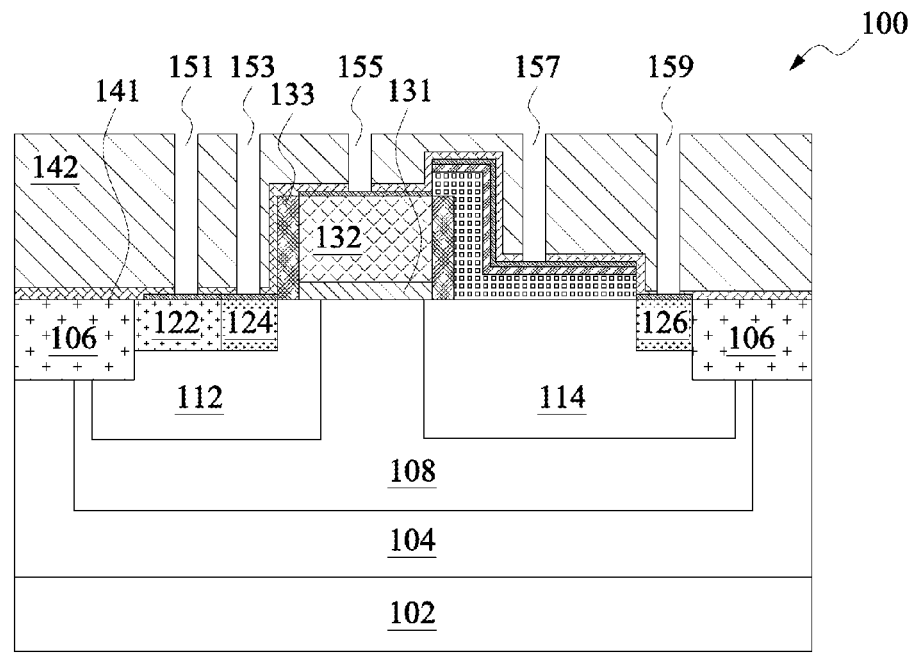
FIG. 13 illustrates a cross section view of the semiconductor device shown in FIG. 12 after an anisotropic etching process is applied to the dielectric layer and the CESL layer of the semiconductor device in accordance with various embodiments of the present disclosure.

FIG. 13 illustrates a cross section view of the semiconductor device shown in FIG. 12 after an anisotropic etching process is applied to the dielectric layer and the CESL layer of the semiconductor device in accordance with various embodiments of the present disclosure. A plurality of openings 151, 153, 155, 157 and 159 are formed by etching the dielectric layer 142. With the help of the CESL layer 141, the etching of the dielectric layer 142 is more precisely controlled. After the CESL layer 141 and dielectric layer 142 in the openings 151, 153, 155, 157 and 159 have been removed. The underlying metal silicide layers over the gate electrode, drain/source regions, the conductive layer and the body pickup region are exposed.

Figure 14:
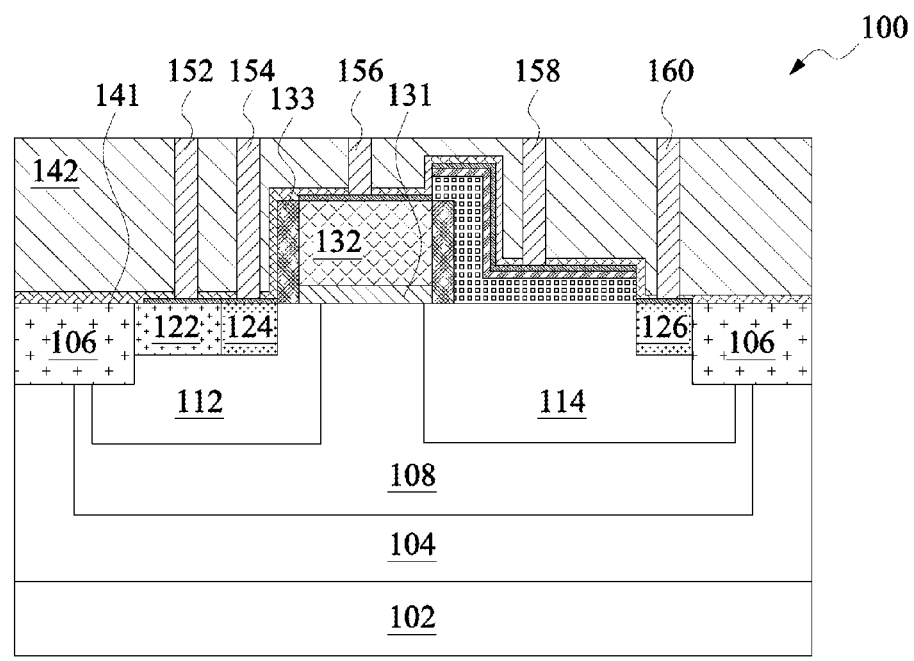
FIG. 14 illustrates a cross section view of the semiconductor device shown in FIG. 13 after metal materials are filled in the openings of the semiconductor device in accordance with various embodiments of the present disclosure.

FIG. 14 illustrates a cross section view of the semiconductor device shown in FIG. 13 after metal materials are filled in the openings of the semiconductor device in accordance with various embodiments of the present disclosure. A metallic material, which includes tungsten, titanium, aluminum, copper, any combinations thereof and/or the like, is filled into the openings 151, 153, 155, 157 and 159, forming contact plugs 152, 154, 156, 158 and 160. It should be noted that the contact plug configuration shown in FIG. 14 is merely an example. A person skilled in the art will recognize there may be many alternatives, modifications and variations. For example, depending on different applications and design needs, the body pickup region 122 and the first drain/source region 124 may share a contact plug.

Figure 15:
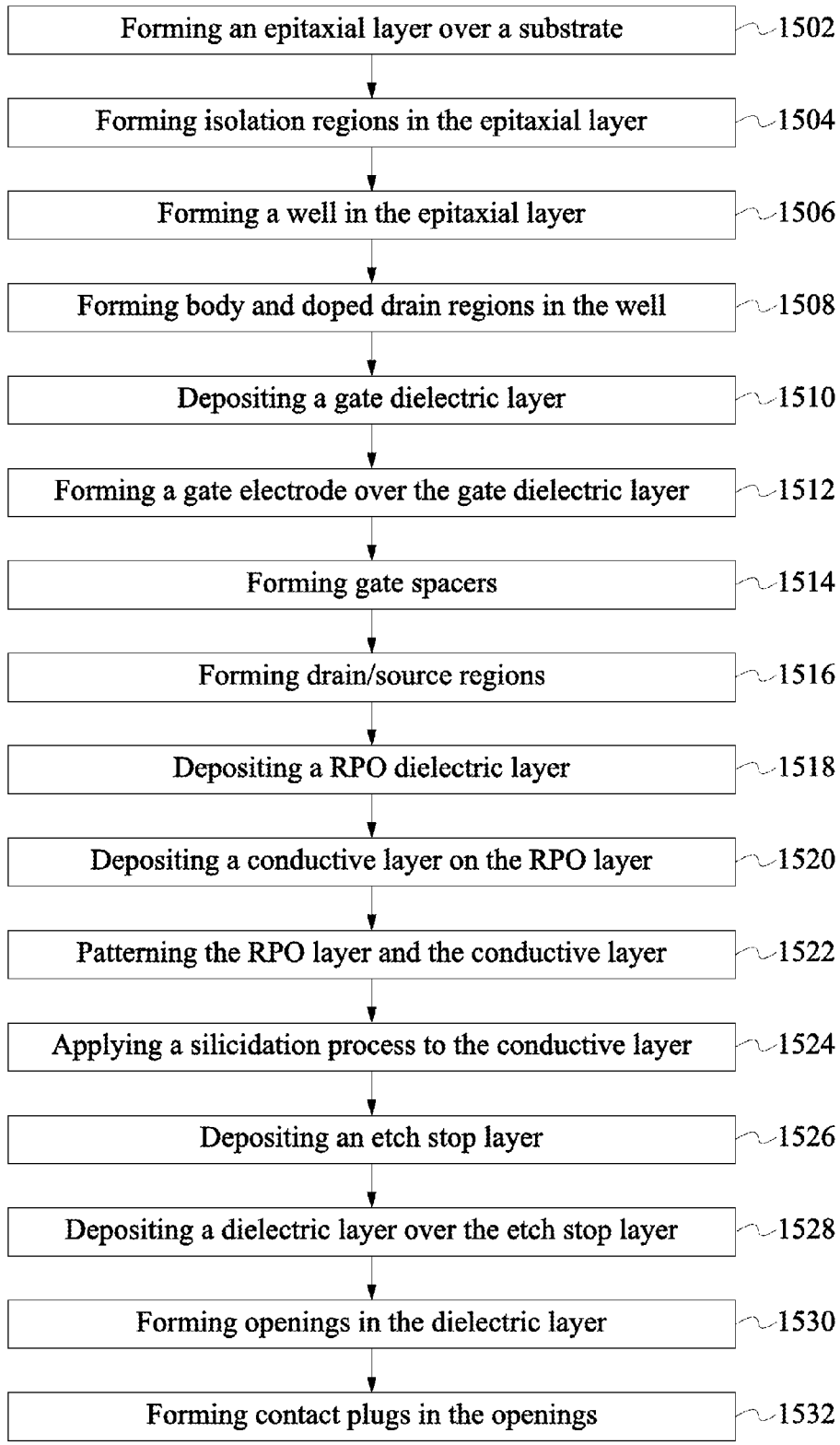
FIG. 15 illustrates a flow chart of a method for forming the semiconductor device shown in FIG. 1 in accordance with various embodiments of the present disclosure.
Figure 16:
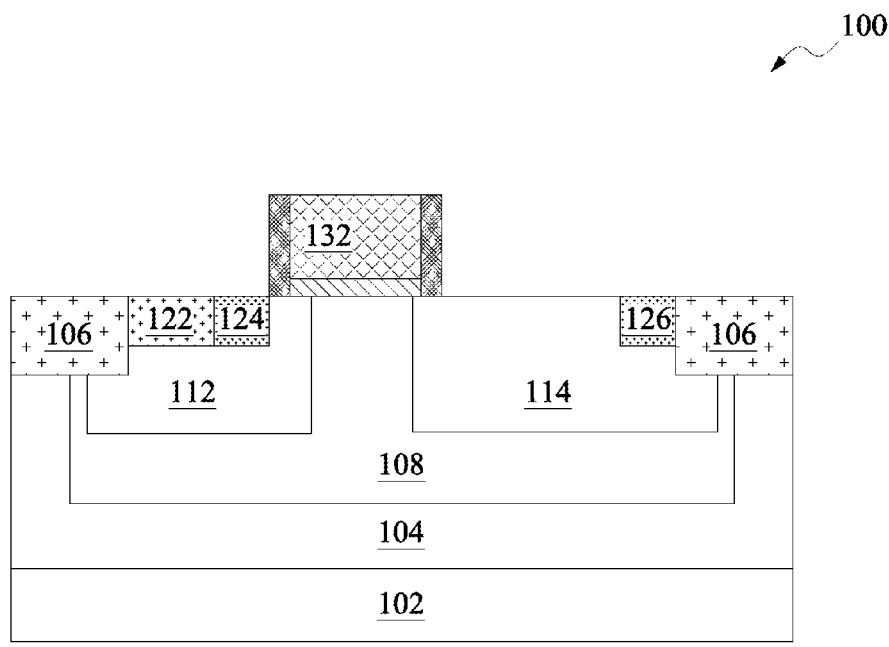
FIGS. 16-21 illustrate cross section views of intermediate steps of fabricating another MOS transistor in accordance with various embodiments of the present disclosure.

FIG. 15 illustrates a flow chart of a method for forming the semiconductor device shown in FIG. 1 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 15 may added, removed, replaced, rearranged and repeated.

At step 1502, an epitaxial layer is grown from a substrate through a suitable epitaxial growth process. At step 1504, a plurality of isolation regions are formed in the epitaxial layer. At step 1506, an n-type well is formed in the epitaxial layer through an ion implantation process. At step 1508, a p-type body region and an n-type doped drain region are formed in the n-type well through suitable ion implantation processes.

At step 1510, a gate dielectric layer is deposited over the substrate through suitable semiconductor deposition processes. At step 1512, a gate electrode layer is deposited over the gate dielectric layer. A patterning process may be applied to the gate dielectric layer and the gate dielectric layer. The remaining portions of the gate dielectric layer and the gate dielectric layer form a gate structure.

At step 1514, a dielectric layer is deposited over the gate structure. The horizontal portions of the dielectric layer are removed by suitable etching processes. The remaining portions of the dielectric layer form gate spacers along sidewalls of the gate structure. At step 1516, the drain, the source and the body pickup regions are formed through suitable ion implantation processes.

At step 1518, a dielectric layer is formed over the substrate through suitable deposition processes. At step 1520, a conductive layer is formed over the dielectric layer through suitable deposition processes. At step 1522, a patterning process is applied to the dielectric layer and the conductive layer. The remaining portions of the conductive layer form a field plate extending from the gate structure to the drain region.

At step 1524, a salicide process is applied to the semiconductor device. During the salicide process, metal silicide layers are formed on the respective drain, source, gate electrode, body pickup and field plate regions. At step 1526, a etch stop layer is deposited over the semiconductor device. At step 1528, a dielectric layer or an ILD layer is deposited over the etch stop layer. At step 1530, a plurality of openings are formed in the dielectric layer. At step 1532, contact plugs are formed in the openings through suitable fabrication processes such as a plating process.

Figure 17:
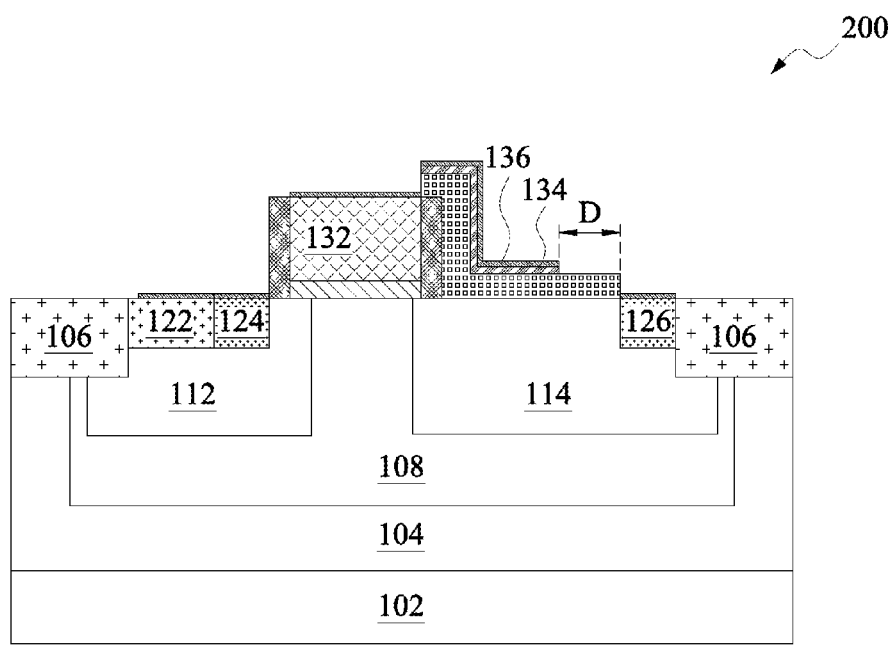
Figure 18:
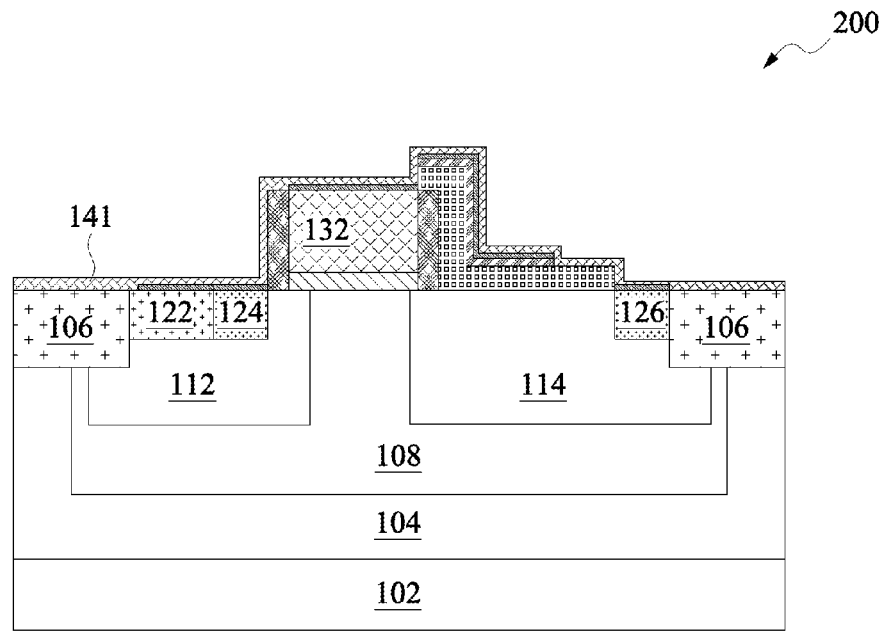
Figure 19:
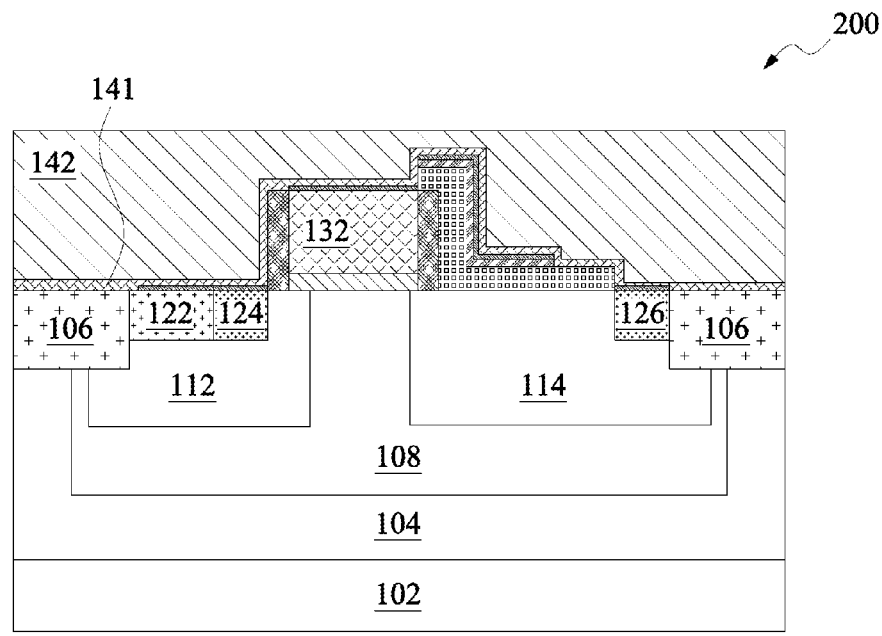
Figure 20:
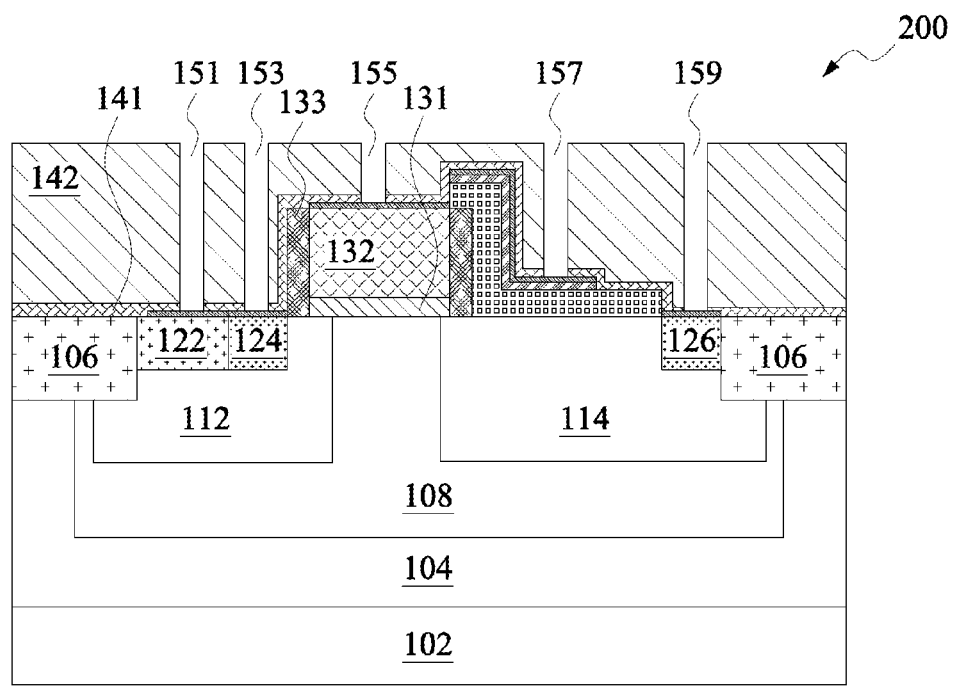
Figure 21:
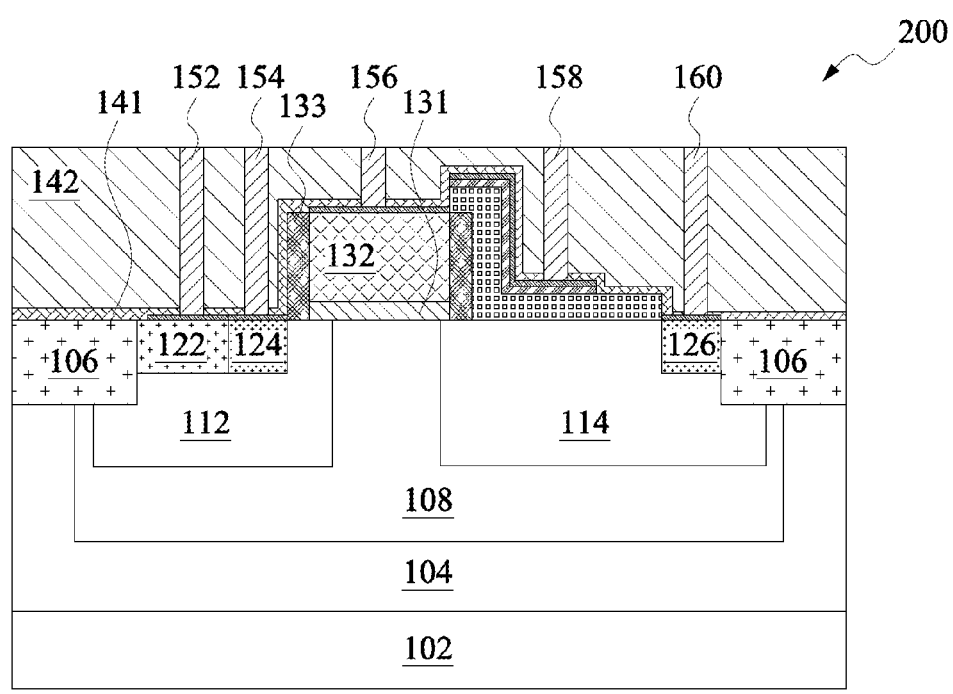

FIGS. 16-21 illustrate cross section views of intermediate steps of fabricating another MOS transistor in accordance with various embodiments of the present disclosure. The fabrication steps shown in FIGS. 16-21 are similar to the fabrication steps shown in FIGS. 9-14 except that two lithography masks are employed during the formation process of the field plate. As shown in FIG. 17, a first mask is employed to define the shape of the conductive layer and form the field plate 136. A second mask is employed to define the shape of the dielectric layer 134. As shown in FIG. 17, there is a gap between the rightmost edge of the field plate 136 and the rightmost edge of the dielectric layer 134. The distance between the rightmost edge of the field plate 136 and the rightmost edge of the dielectric layer 134 is defined as D. The value of D may vary based upon different applications and design needs. The semiconductor device 200 shown in FIGS. 16-21 is similar to the semiconductor device 100 shown in FIG. 1 except that the length of the portion of the dielectric layer over the drift region is greater than the length of the portion of the field plate over the drift region.

Figure 22:
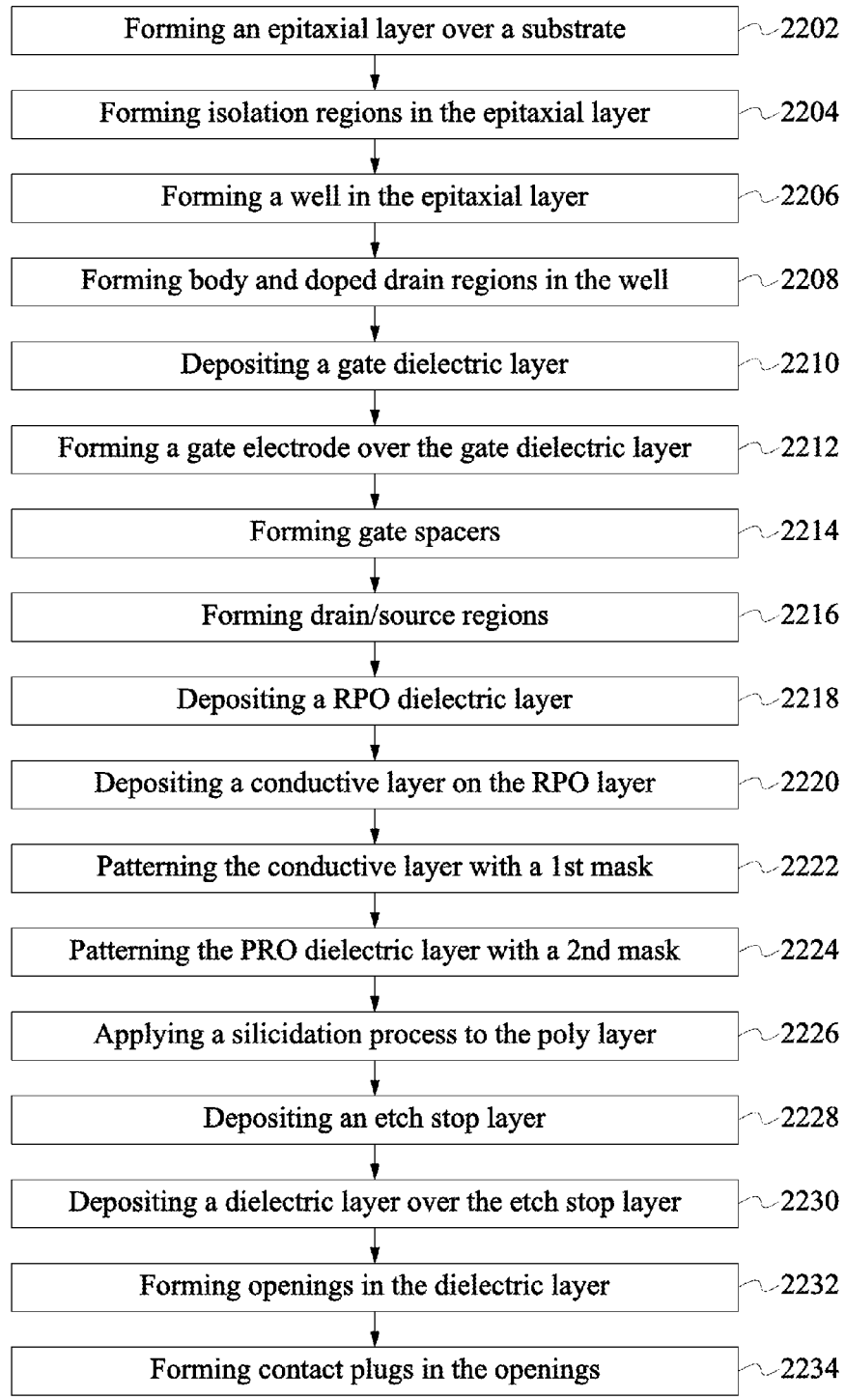
FIG. 22 illustrates a flow chart of a method for forming the semiconductor device shown in FIGS. 16-21 in accordance with various embodiments of the present disclosure.

FIG. 22 illustrates a flow chart of a method for forming the semiconductor device shown in FIGS. 16-21 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 22 may added, removed, replaced, rearranged and repeated.

The fabrication steps 2202-2220 and 2226-2234 are similar to steps 1502-1520 and 1524-1532 shown in FIG. 15, and hence are not discussed in detail herein again to avoid unnecessary repetition. At step 2222, the conductive layer is patterned using a first mask. At step 2224, the dielectric layer is patterned using a second mask. By using two different masks, the shape of the field plate can be controlled accordingly.

Figure 23:
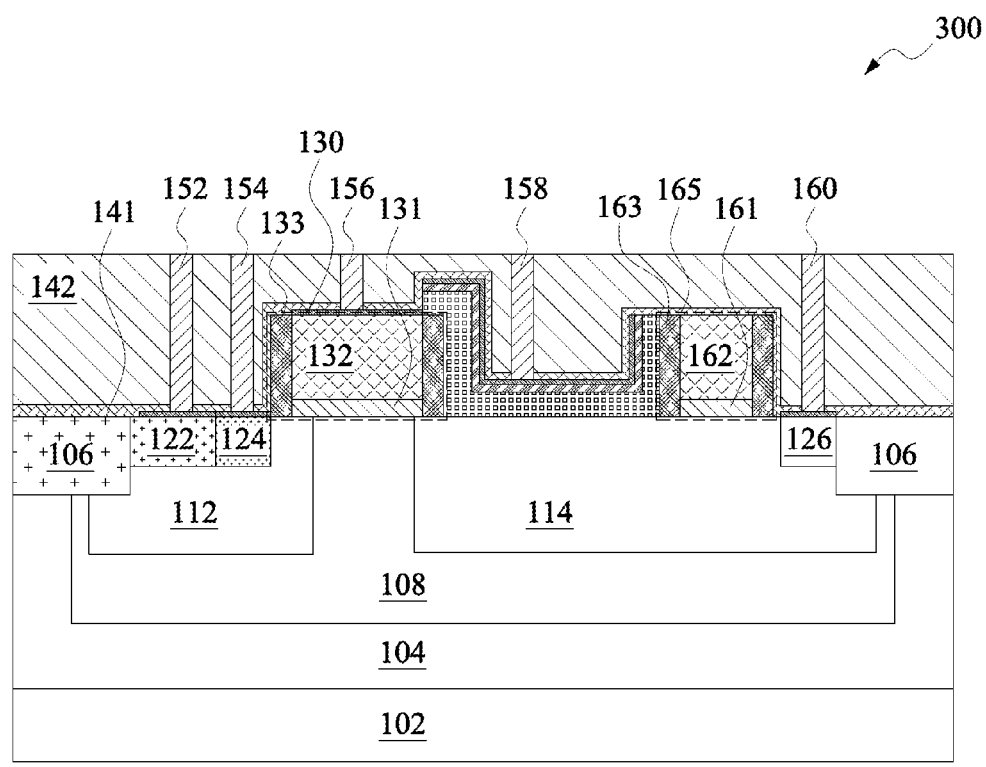
FIG. 23 illustrates a cross section view of another MOS transistor in accordance with various embodiments of the present disclosure.

FIG. 23 illustrates a cross section view of another MOS transistor in accordance with various embodiments of the present disclosure. The MOS transistor 300 is similar to the MOS transistor 100 shown in FIG. 1 except that a dummy gate structure 165 is formed between the gate structure 130 and the drain 126. As shown in FIG. 23, the dummy gate structure 165 includes a gate dielectric layer 161, a gate electrode 162 and a gate spacer 63. Furthermore, as shown in FIG. 23, the field plate 136 is formed between the gate structure 130 and the dummy gate structure 165.

One advantageous feature of having the dummy gate structure 165 is that the dummy gate structure 165 helps to further improve the isolation between the drain the gate structure. As a result, the reliability of the MOS transistor 300 shown in FIG. 23 can be improved.

Figure 24:
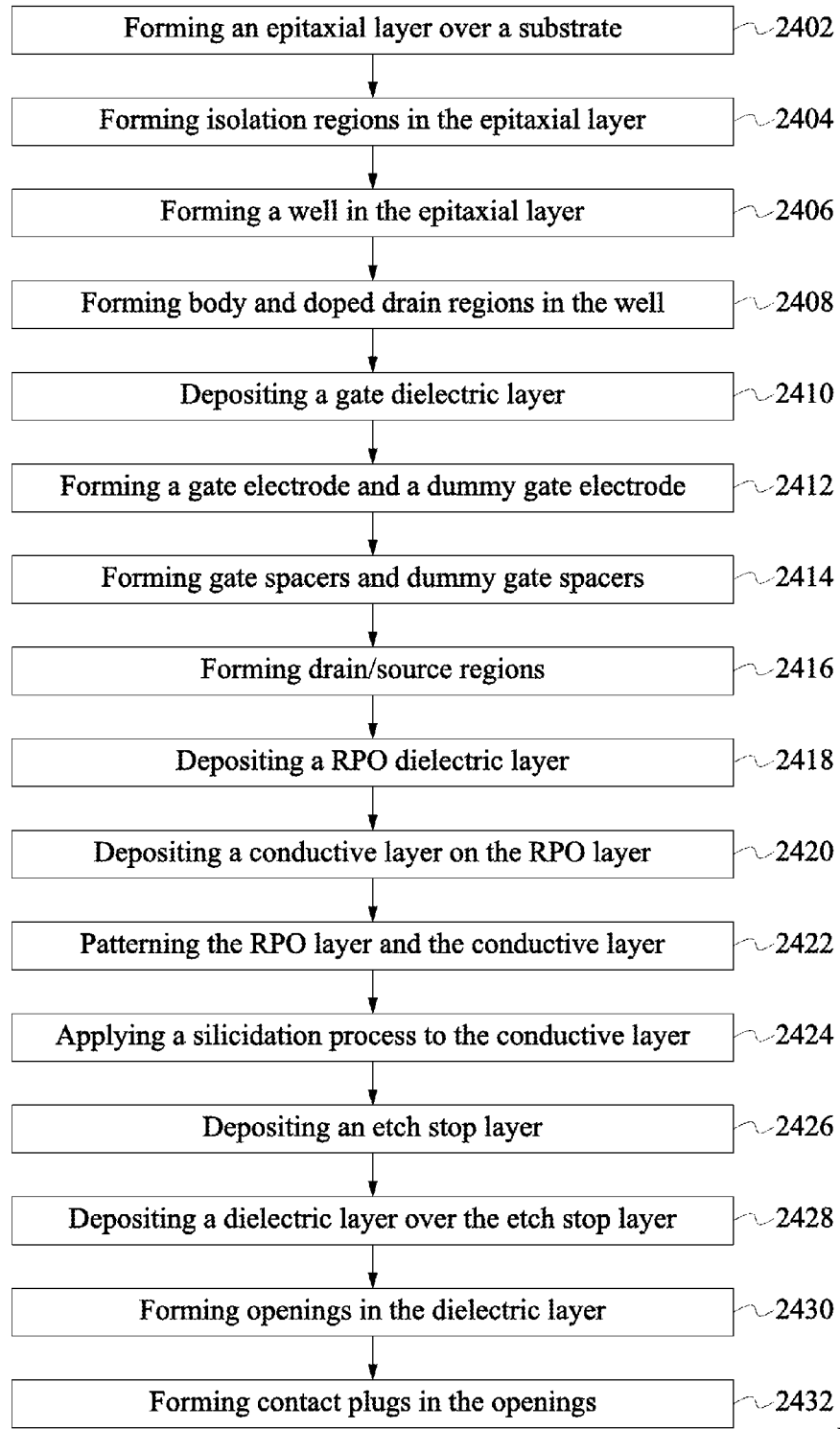
FIG. 24 illustrates a flow chart of a method for forming the semiconductor device shown in FIG. 23 in accordance with various embodiments of the present disclosure.

FIG. 24 illustrates a flow chart of a method for forming the semiconductor device shown in FIG. 23 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 24 may added, removed, replaced, rearranged and repeated.

The fabrication steps 2402-2410 and 2416-2430 shown in FIG. 24 are similar to steps 1502-1510 and 1514-1532 shown in FIG. 15, and hence are not discussed in detail herein again to avoid unnecessary repetition. At step 2412, both a gate electrode and a dummy gate electrode are formed over the substrate. At step 2414, both gate spacers and dummy gate spacers are formed along the respective gate structures.

In accordance with an embodiment, a method comprises forming a gate structure over a substrate, forming a gate spacer along sidewalls of the gate structure, forming a first drain/source region and a second drain/source region on opposite sides of the gate structure, wherein a sidewall of the first drain/source region is vertically aligned with a first sidewall of the gate spacer, depositing a dielectric layer over the substrate, depositing a conductive layer over the dielectric layer, patterning the dielectric layer and the conductive layer to form a field plate, wherein the dielectric layer comprises a horizontal portion extending from the second drain/source region to a second sidewall of the gate spacer and a vertical portion formed along the second sidewall of the gate spacer, forming a plurality of metal silicide layers by applying a salicide process to the conductive layer, the gate structure, the first drain/source region and the second drain/source region and forming contact plugs over the plurality of metal silicide layers.

In accordance with an embodiment, an apparatus comprises a first drain/source region and a second drain/source region on opposite sides of a gate structure, a conductive field plate formed between the gate structure and the second drain/source region, wherein the conductive field plate comprises a metal silicide layer over a conductive layer, and wherein the conductive layer is over a dielectric layer, and wherein a horizontal portion of the dielectric layer extends from the second drain/source region to a sidewall of a gate spacer formed along the gate structure and a vertical portion of the dielectric layer is formed along the sidewall of the gate spacer and a plurality of contact plugs connected to the first drain/source region, the second drain/source region and the conductive layer respectively, wherein the conductive layer and a contact plug are connected through the metal silicide layer formed over the conductive layer.

In accordance with an embodiment, a method comprises growing an epitaxial layer over a substrate, forming a plurality of isolation regions in the epitaxial layer, implanting ions in the epitaxial layer to form a well, forming a body region and a doped drain region in the well, forming a gate structure over the substrate, forming a gate spacer along sidewalls of the gate structure, forming a source region in the body region and a drain region in the doped drain region, wherein the source region and the drain region are on opposite sides of the gate structure, and wherein a sidewall of the source region is vertically aligned with a first sidewall of the gate spacer, depositing a dielectric layer over the substrate, depositing a conductive layer over the dielectric layer, patterning the dielectric layer and the conductive layer to form a field plate, wherein the field plate comprises a horizontal portion formed between the drain region and a second sidewall of the gate structure, and a vertical portion formed along the second sidewall of the gate spacer, applying a salicide process to the conductive layer, the drain region and the source region to from a plurality of metal silicide layers and forming contact plugs over the plurality of metal silicide layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate structure over a substrate;
    forming gate spacers along sidewalls of the gate structure, the gate spacers comprising a first gate spacer along a first sidewall of the gate structure and a second gate spacer along a second sidewall of the gate structure;
    forming a first drain/source region and a second drain/source region on opposite sides of the gate structure, wherein a sidewall of the first drain/source region is vertically aligned with a first-sidewall of the first gate spacer;
    depositing a dielectric layer over the substrate;
    depositing a conductive layer over the dielectric layer;
    patterning the dielectric layer and the conductive layer to form a field plate, wherein the dielectric layer comprises a first horizontal portion extending from the second drain/source region to a first sidewall of the second gate spacer, a vertical portion formed along the first sidewall of the second gate spacer, and a second horizontal portion extending over the second gate spacer to the gate structure, wherein the second drain/source region and the gate structure are free of the dielectric layer, and wherein a section of the first horizontal portion proximal to the second source/drain region is not covered by the conductive layer;
    simultaneously forming metal silicide layers by simultaneously applying a salicide process over each of the conductive layer, the first drain/source region and the second drain/source region; and
    forming contact plugs over the metal silicide layers.

2. The method of claim 1, further comprising:
    patterning the conductive layer with a first mask; and
    patterning the dielectric layer with a second mask.

3. The method of claim 1, further comprising:
    depositing poly-silicon on the dielectric layer to from the conductive layer.

4. The method of claim 1, further comprising:
    during the step of the forming the gate structure over the substrate, forming a dummy gate structure between the gate structure and the second drain/source region.

5. The method of claim 4, further comprising:
    forming the field plate between the gate structure and the dummy gate structure.

6. The method of claim 5, wherein:
    after the step of forming the field plate between the gate structure and the dummy gate structure, the field plate comprises a second vertical portion formed along a sidewall of the dummy gate structure.

7. The method of claim 1, wherein:
    the first drain/source region is a source region; and
    the second drain/source region is a drain region.

8. The method of claim 1, further comprising:
    growing a p-type epitaxial layer over a p-type substrate;
    forming a plurality of isolation regions in the p-type epitaxial layer;
    implanting ions in the p-type epitaxial layer to form an n-type well;
    forming a p-type body region and an n-type doped drain region in the n-type well; and
    depositing a gate dielectric layer over the p-type substrate;

depositing a gate electrode layer over the gate dielectric layer; and
patterning the gate dielectric layer and the gate electrode layer to form the gate structure.

9. The method of claim 1, further comprising:
forming a first contact plug connected to the conductive layer, a second contact plug connected to the first drain/source region and a third contact plug connected to the second drain/source region in a same fabrication step.

10. The method of claim 1, further comprising:
patterning the dielectric layer and the conductive layer using a same mask.

11. A method comprising:
growing an epitaxial layer over a substrate;
forming a plurality of isolation regions in the epitaxial layer;
implanting ions in the epitaxial layer to form a well;
forming a body region and a doped drain region in the well;
forming a gate structure over the substrate;
forming gate spacers along sidewalls of the gate structure;
forming a source region in the body region and a drain region in the doped drain region, wherein the source region and the drain region are on opposite sides of the gate structure, and wherein a first sidewall of the source region is vertically aligned with a sidewall of a first gate spacer;
forming a body pickup region adjacent to the source region;
depositing a dielectric layer over the substrate;
depositing a conductive layer over the dielectric layer;
patterning the dielectric layer and the conductive layer to form a field plate, wherein the dielectric layer comprises a first horizontal portion formed to extend from the drain region to a first sidewall of a second gate spacer, a vertical portion formed along the first sidewall of the second gate spacer, and a second horizontal portion extending over the second gate spacer to the gate structure, wherein the drain region and gate structure are free of the dielectric layer, and wherein the first horizontal portion of the dielectric layer comprises a section of the dielectric layer proximal to the drain region that is not covered by the conductive layer;
applying a simultaneous salicide process to the conductive layer, the body pickup region, the drain region and the source region to from metal silicide layers; and
forming contact plugs over the metal silicide layers, separate contact plugs being formed to each of the conductive layer, the gate structure, the body pickup region, the drain region, and the source region.

12. The method of claim 11, further comprising:
depositing a gate dielectric layer over the substrate;
depositing a gate electrode layer over the gate dielectric layer; and
patterning the gate dielectric layer and the gate electrode layer to form the gate structure and a dummy gate structure.

13. The method of claim 12, further comprising:
forming the field plate between the gate structure and the dummy gate structure.

14. The method of claim 11, wherein:
forming the field plate between the gate structure and the drain region.

15. The method of claim 11, wherein:
the conductive layer is formed of poly-silicon.

16. A method comprising:
forming a first drain/source region and a second drain/source region in a substrate and on opposite sides of a gate structure, wherein a sidewall of the first drain/source region is vertically aligned with a first sidewall of a first gate spacer of the gate structure;
depositing a dielectric layer over the substrate;
depositing a conductive layer over the dielectric layer;
patterning the conductive layer with a first mask and patterning the dielectric layer with a second mask to form a field plate, wherein:
after patterning the conductive layer and the dielectric layer, the dielectric layer comprises a first horizontal portion extending from the second drain/source region to a first sidewall of a second gate spacer, a vertical portion formed along the first sidewall of the second gate spacer, and a second horizontal portion extending over the second gate spacer to the gate structure, wherein the second drain/source region and gate structure are free of the dielectric layer; and
the conductive layer comprises a first horizontal portion over the first horizontal portion of the dielectric layer, a vertical portion formed along the vertical portion of the dielectric layer, and a second horizontal portion formed over the second horizontal portion of the dielectric layer, wherein the first horizontal portion of the conductive layer has a length less than a length of the first horizontal layer of the dielectric layer, leaving an end of the dielectric layer proximal to the second drain/source region uncovered by the conductive layer;
simultaneously forming metal silicide layers by simultaneously applying a salicide process to the conductive layer, the first drain/source region and the second drain/source region; and
forming contact plugs over the metal silicide layers.

17. The method of claim 16, further comprising:
prior to forming the first drain/source region and the second drain/source region, forming the gate structure over the substrate; and
forming gate spacers along sidewalls of the gate structure.

18. The method of claim 16, further comprising:
the dielectric layer is a resist protection oxide (RPO) dielectric layer.

19. The method of claim 9, further comprising:
forming a body pickup region adjacent to the first drain/source region;
applying a salicide process to the body pickup region; and
forming a fourth contact plug to the body pickup region.

20. The method of claim 16, further comprising:
forming a body pickup region adjacent to the first drain/source region;
applying a salicide process to the body pickup region; and
forming a separate contact plug to the body pickup region.

21. The method of claim 11, wherein the dielectric layer extends over the doped drain region from a sidewall of the gate structure to the drain region, the doped drain region extending continuously to a depth below the isolation regions.

* * * * *